(12) United States Patent
Eickbush et al.

(10) Patent No.: US 12,370,601 B1
(45) Date of Patent: Jul. 29, 2025

(54) FORMING MULTI-LAYER FOILS USING ADDITIVE MANUFACTURING DELAMINATION AND ACCELEROMETER APPLICATION

(71) Applicant: Honeywell Federal Manufacturing & Technologies, LLC, Kansas City, MO (US)

(72) Inventors: Ryan John Eickbush, Grandview, MO (US); Logan Thomas Walz, Belton, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 18/605,742

(22) Filed: Mar. 14, 2024

Related U.S. Application Data

(60) Provisional application No. 63/490,819, filed on Mar. 17, 2023.

(51) Int. Cl.
*B22F 10/14* (2021.01)

(52) U.S. Cl.
CPC .................................... *B22F 10/14* (2021.01)

(58) Field of Classification Search
CPC .......... B22F 10/14; B22F 3/10; B22F 3/2027; B22F 3/1028; B22F 3/24; B22F 2003/247; B22F 2003/1046; B22F 2003/248; H05K 3/02; H05K 3/10; H05K 3/12; H05K 3/1241; H05K 3/125; H05K 3/1283; H05K 3/1291; H05K 3/207; C23C 24/08; C23C 24/082; C23C 24/085; C23C 24/10; C23C 24/103; C23C 24/106
See application file for complete search history.

(56) References Cited

U.S. PATENT DOCUMENTS

| | | | | |
|---|---|---|---|---|
| 4,965,092 A | * | 10/1990 | Hayduk, Jr. | H05K 3/1291 257/E21.534 |
| 6,074,893 A | * | 6/2000 | Nakata | H05K 3/207 29/877 |
| 7,386,936 B2 | * | 6/2008 | Huhtasalo | H05K 3/207 156/240 |
| 2016/0340519 A1 | * | 11/2016 | Yang | C09D 5/24 |

\* cited by examiner

*Primary Examiner* — Michael P Wieczorek
(74) *Attorney, Agent, or Firm* — Erise IP, P.A.

(57) ABSTRACT

A method may apply an ink layer in a desired pattern onto a substrate with a substrate coefficient of thermal expansion. A method may heat the ink layer and the substrate at a temperature increase ramp rate to a predefined target temperature for the ink layer, to obtain a metallic layer in substantially the desired pattern and with a metallic coefficient of thermal expansion. A method may cool the metallic layer and the substrate at a temperature decrease ramp rate, wherein a difference between the substrate coefficient of thermal expansion and the metallic coefficient of thermal expansion, in combination with the temperature increase ramp rate and the temperature decrease ramp rate, operates to completely delaminate the metallic layer from the substrate, thereby producing the patterned metallic foil.

11 Claims, 5 Drawing Sheets

FORMING MULTI-LAYER FOILS USING ADDITIVE MANUFACTURING DELAMINATION AND ACCELEROMETER APPLICATION

RELATED APPLICATIONS

This patent application claims priority benefit, with regard to all common subject matter, of earlier-filed U.S. Provisional Patent Application No. 63/490,819 filed Mar. 17, 2023, and entitled "FORMING MULTI-LAYER FOILS USING ADDITIVE MANUFACTURING DELAMINATION AND ACCELEROMETER APPLICATION." The above-referenced patent application is hereby incorporated by reference in its entirety into the present application.

STATEMENT OF GOVERNMENT SUPPORT

This invention was made with government support under contract number DE-NA0002839 awarded by the United States Department of Energy/National Nuclear Security Administration. The government has certain rights in the invention.

BACKGROUND

1. Field

Embodiments of the disclosed invention broadly relate to thin foils and, more particularly, to a method of manufacturing thin foils and a microelectronic application thereof.

2. Related Art

Thin foils have broad applicability in many fields due to their versatility, size, and customizability. For example, thin foils may be useful in developing micro-accelerometer systems to discreetly monitor acceleration. Other applications of thin foils include microelectronics, e-textiles, wearable electronics, and stretchable electronics. While thin foils have many applications, manufacturing thin foils using traditional electronics manufacturing processes is difficult and complex. For example, traditional lithography processes are time-consuming and complex, leaving little room for error.

However, direct write technologies paired with additive manufacturing techniques may provide a way to manufacture such thin foils. More particularly, taking advantage of differing coefficients of thermal expansion between layers during manufacturing may provide a simpler, faster process for manufacturing thin foils. The coefficient of thermal expansion (CTE) of a material relates to the amount by which a material's dimensions change when said material experiences a temperature change.

In microelectronics manufacturing, it is known that a significant mismatch in CTE values between the various materials utilized in additive manufacturing may cause a loss of adhesion between layers or other forms of damage during temperature changes. For example, as the temperature rises, a high CTE material may expand and lose adhesion to an attached substrate with a low CTE, resulting in cracking, chipping, delamination, or other forms of damage. Existing microelectronics manufacturing processes rely on adhesion; as such, delamination is undesirable and typically results in a wasted product. Aspects of the invention make productive use of delamination in a novel foil manufacturing process.

SUMMARY

In some aspects, the techniques described herein relate to a method of manufacturing a patterned metallic foil including: applying an ink layer in a desired pattern onto a substrate with a substrate coefficient of thermal expansion; heating the ink layer and the substrate at a temperature increase ramp rate to a predefined target temperature for the ink layer, to obtain a metallic layer in substantially the desired pattern and with a metallic coefficient of thermal expansion; and cooling the metallic layer and the substrate at a temperature decrease ramp rate, wherein a difference between the substrate coefficient of thermal expansion and the metallic coefficient of thermal expansion, in combination with the temperature increase ramp rate and the temperature decrease ramp rate, operates to completely delaminate the metallic layer from the substrate, thereby producing the patterned metallic foil.

In some aspects, the techniques described herein relate to a method, wherein the temperature increase ramp rate is greater than the temperature decrease ramp rate.

In some aspects, the techniques described herein relate to a method, wherein the temperature increase ramp rate is approximately 25 degrees Celsius per minute and the temperature decrease ramp rate is approximately 5 degrees Celsius per minute.

In some aspects, the techniques described herein relate to a method, wherein the ink layer includes copper particles, and the metallic layer includes metallic copper.

In some aspects, the techniques described herein relate to a method, wherein the patterned metallic foil has a thickness of approximately 2 μm.

In some aspects, the techniques described herein relate to a method, wherein the ink layer is applied to the substrate via aerosol jet printing.

In some aspects, the techniques described herein relate to a method, wherein the substrate includes alumina.

In some aspects, the techniques described herein relate to a method, wherein heating the ink layer to the predefined target temperature produces the metallic layer via a process selected from a set consisting of curing, sintering, and annealing.

In some aspects, the techniques described herein relate to a method, wherein the substrate has a desired non-planar surface, and wherein the patterned metallic foil conforms to the desired non-planar surface.

In some aspects, the techniques described herein relate to a method, further including: prior to applying the ink layer to the substrate, applying an ink sublayer onto the substrate such that the ink sublayer is substantially covered by the ink layer, wherein the ink layer includes a first type of metallic particles, and the ink sublayer includes a second type of metallic particles, such that the patterned metallic foil includes layers of distinct metals.

In some aspects, the techniques described herein relate to a differential capacitance accelerometer including: a non-conductive base layer; a lower electrode applied as an electrical trace on the non-conductive base layer; a moveable electrode including a foil, wherein the foil is manufactured through a process including: applying an ink layer in a pattern substantially similar to the lower electrode onto a substrate with a substrate coefficient of thermal expansion; heating the ink layer and the substrate to a predefined target temperature for the ink layer, to obtain a metallic layer in the pattern substantially similar to the lower electrode and with a metallic coefficient of thermal expansion; and cooling the metallic layer and the substrate, wherein a difference between the substrate coefficient of thermal expansion and the metallic coefficient of thermal expansion operates to completely delaminate the metallic layer from the substrate, thereby producing the foil; a plurality of pillars applied to the non-conductive base layer and suspending the moveable electrode over the lower electrode; and a dielectric between the lower electrode and the moveable electrode.

In some aspects, the techniques described herein relate to a differential capacitance accelerometer, further including a third electrode suspended above the foil and an additional dielectric between the foil and the third electrode.

In some aspects, the techniques described herein relate to a differential capacitance accelerometer, further including a voltage source connected to the lower electrode.

In some aspects, the techniques described herein relate to a differential capacitance accelerometer, wherein each pillar of the plurality of pillars includes a plurality of metallic layers successively applied using aerosol jet printing and sintering.

In some aspects, the techniques described herein relate to a differential capacitance accelerometer, wherein the plurality of pillars includes at least one electrode pillar soldered to the foil and electrically connected to an additional electrical trace applied to the non-conductive base layer.

In some aspects, the techniques described herein relate to a differential capacitance accelerometer, wherein the dielectric is air.

In some aspects, the techniques described herein relate to a differential capacitance accelerometer, wherein the foil has a thickness of approximately 2 µm.

In some aspects, the techniques described herein relate to a differential capacitance accelerometer, wherein the lower electrode is applied to the substrate using aerosol jet printing and sintering.

In some aspects, the techniques described herein relate to a differential capacitance accelerometer, wherein the ink layer and the substrate are heated at a temperature increase ramp rate of approximately 25 degrees Celsius per minute and cooled at a temperature decrease ramp rate of approximately 5 degrees Celsius per minute.

In some aspects, the techniques described herein relate to a differential capacitance accelerometer, wherein the foil is a copper foil.

DETAILED DESCRIPTION

At a high level, embodiments of the invention are directed to a method of manufacturing thin (single-layer or multi-layer) foils and an accelerometer system utilizing thin foils thereof. The method may include applying an ink sublayer, an ink layer, and an ink sublayer onto a substrate. The method may further include heating and cooling all layers and then removing the layers from the substrate, forming a thin foil. The accelerometer system may include a moveable thin foil electrode manufactured using the process described above. The moveable thin foil electrode may be suspended above or between one or more electrodes by one or more pillars. The moveable thin foil electrode paired with the one or more electrodes may then form one or more capacitors, serving the purpose of measuring acceleration given changes in capacitance.

The subject matter of embodiments of the invention is described in detail below to meet statutory requirements; however, the description itself is not intended to limit the scope of claims. Rather, the claimed subject matter might be embodied in other ways to include different steps or combinations of steps similar to the ones described in this document in conjunction with other present or future technologies. Minor variations from the description below will be obvious to one skilled in the art and are intended to be captured within the scope of the claimed invention. Terms should not be interpreted as implying any particular ordering of various steps described unless the order of individual steps is explicitly described.

The following detailed description of embodiments of the invention references the accompanying drawings that illustrate specific embodiments in which the invention can be practiced. The embodiments are intended to describe aspects of the invention in sufficient detail to enable those skilled in the art to practice the invention. Other embodiments can be utilized, and changes can be made without departing from the scope of the invention. The following detailed description is, therefore, not to be taken in a limiting sense. The scope of embodiments of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, or act described in one embodiment may also be included in other embodiments but is not necessarily included. Thus, the technology can include a variety of combinations and/or integrations of the embodiments described herein.

Figure 1:
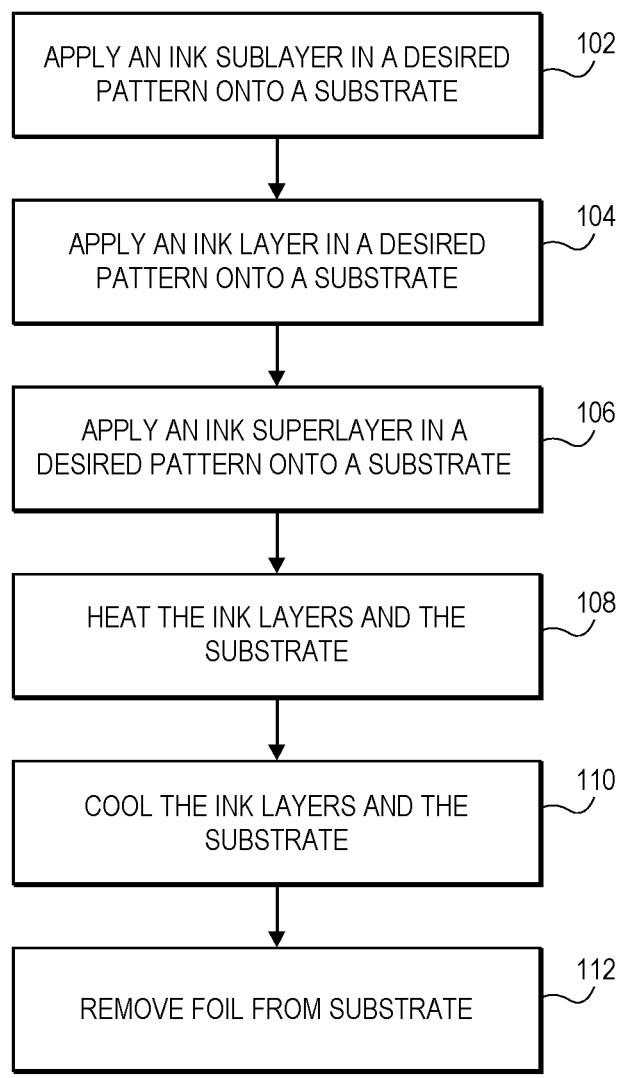
FIG. 1 depicts an example of a method for manufacturing a patterned foil in accordance with embodiments of the invention.

Turning now to FIG. 1, one example of a method for manufacturing a patterned metallic foil is depicted and generally referred to as method 100. In some embodiments, method 100 may be carried out at least in part using an aerosol jet printing system. In other embodiments, method 100 may be carried out at least in part using any printing system now known or later developed, including 3-dimensional printing systems, inkjet systems, droplet-based systems, extrusion-based deposition systems, laser-based systems, tip-based deposition systems, and similar printing systems.

Method 100 begins at step 102, where an ink sublayer may be applied in a desired pattern onto a substrate. In some embodiments, the ink sublayer may cover only a portion of the substrate. In other embodiments, the ink sublayer may cover the entire substrate. In some embodiments, the ink sublayer may be a metallic ink comprising metallic particles suspended in a solvent. In such embodiments, the metallic particles are copper particles, silver particles, or any other type of metallic particle. In additional embodiments, however, the ink sublayer may be a conductive nonmetallic ink. For example, the ink may contain graphite particles suspended in the solvent. In some embodiments, the ink sublayer may be a nonconductive ink, such as a plastic-based ink, polymer-based ink, and similar nonconductive inks.

Broadly, the ink for the ink sublayer, the ink layer, and the ink superlayer (discussed below) are selected such that at least one layer is made up of a material with a coefficient of thermal expansion sufficiently different from the coefficient of thermal expansion of the substrate so as to cause delamination when the completed set of ink layers and the substrate are jointly heated and/or cooled. In some embodiments, the material forming the ink sublayer may be selected such that the difference in coefficients of thermal expansion between the ink sublayer and the substrate is large enough to result in the ink sublayer delaminating from the substrate. For some combinations of inks and substrates, the difference in the coefficients of thermal expansion may not be sufficient to result in delamination without the presence of an additional material. For example, the ink sublayer may need an additional ink layer with a coefficient of thermal expansion that differs greatly from that of the substrate to assist in delaminating the ink sublayer from the substrate. In such a case, the additional ink layer may be removed from the ink sublayer after delamination. The ink sublayer, however, may adhere to one or more additional ink layers.

Processing then proceeds to step 104, where an ink layer is applied in a desired pattern onto a substrate. As with the ink sublayer discussed above, the ink layer may be formed from metallic or nonmetallic inks as well as conductive or non-conductive inks. For example, the ink layer may be formed from a copper ink. In some embodiments, the material forming the ink layer may be selected such that the difference in coefficients of thermal expansion between the ink layer and the substrate is large enough to result in the ink layer delaminating from the substrate.

In some embodiments, the material forming the substrate may be any suitable substrate material now known or later developed, including alumina, ceramic, glass, and any similar substrate material. In further embodiments, the substrate may be any planar or non-planar shape. For example, the substrate may be a flat surface. For another example, the substrate may be a curved surface. Any technology now known or later developed for applying the ink to the substrate is contemplated as being within the scope of the invention. Any printing system may be utilized to deposit the ink layer onto the substrate, including, but not limited to, aerosol jet printing systems, 3-dimensional printing systems, inkjet systems, droplet-based systems, extrusion-based deposition systems, laser-based systems, tip-based deposition systems, and similar manufacturing systems.

Processing then continues to step 106, where an ink superlayer is applied in a desired pattern onto a substrate. Broadly, considerations applicable to the ink sublayer, ink layer, and ink superlayer may be applicable to all layers. For example, the considerations applicable to the ink sublayer may also be applicable to the ink superlayer. In some embodiments, the material forming the ink superlayer may be the same as that of the ink sublayer. For example, both the ink sublayer and ink superlayer may be formed from silver ink. In other embodiments, the material forming the ink superlayer may be different from that of the ink sublayer. In some embodiments, the ink superlayer may be used to apply pads to the foil for later soldering.

Processing then proceeds to step 108, where the ink layers and the substrate are heated (e.g., treated) to a predefined target temperature to obtain a metallic foil layer. Any number of heating methods now known or later developed may be utilized, including the use of convection, radiant, conduction, and any combination thereof. In some embodiments, treating the ink layers may be accomplished by curing, sintering, annealing, and similar treatment methods. The treating of the ink layers may prove advantageous by reducing the resistance between the ink layers and the substrate upon delamination. For example, treating the ink may include a heating and cooling process to sinter the metallic particles into a conductive metallic layer, as discussed below with respect to FIG. 2.

In some embodiments, the peak temperature the ink layers and the substrate may be heated to may be 450° C. In other embodiments (for example, in some embodiments where the metallic particles are copper), the peak temperature the ink layers and the substrate may be heated to may be 300° C. The peak temperature used to heat the ink layers and the substrate may be dependent on one or more of the metals used, the solvents used, the treatment process used, and the like. In some embodiments, the rate at which the temperature is increased (e.g., the temperature increase ramp rate) may be 25° C./min (i.e., 25 degrees Celsius per minute). In other embodiments, the temperature increase ramp rate may be between 24° C./min and 26° C./min. In still other embodiments, the temperature increase ramp rate may be between 23° C./min and 27° C./min. In further embodiments, the temperature increase ramp rate may be between 20° C./min and 30° C./min.

Processing then continues with step 110, where the ink layers and the substrate are cooled. In some embodiments, the ink layers and the substrate may be cooled to an ambient temperature. The cooling temperature of the ink layers and the substrate may be dependent on one or more of the metals used, the solvents used, the treatment process used, and the like. In some embodiments, the rate at which the temperature is decreased (e.g., the temperature decrease ramp rate) may be approximately 5° C./min. In other embodiments, the temperature decrease ramp rate may be between 3° C./min and 7° C./min. In still other embodiments, the temperature decrease ramp rate may be between 4° C./min and 6° C./min. In further embodiments, the temperature decrease ramp rate may be approximately less than 10° C./min.

In some embodiments, the cooling of the ink layers and the substrate may be completed with the ink layers having delaminated from the substrate. In other embodiments, the cooling of the ink layers and the substrate may be completed after a predetermined amount of time has passed. In still other embodiments, the cooling of the ink layers and the substrate may be completed after a predetermined temperature is reached. In some embodiments, the heating process may operate to completely delaminate the metallic foil from the substrate. In other embodiments, the cooling process may operate to completely delaminate the metallic foil from the substrate. In still other embodiments, the heating process and the cooling process may operate in concert to delaminate the metallic foil from the substrate. In yet other embodiments, holding the foil at the holding temperature may additionally contribute to the delamination process.

Processing ends at step 112, where the foil is removed from the substrate when delamination of the ink layers from the substrate has occurred, thereby producing the patterned metallic foil. A foil may have any number of ink layers, ink sublayers, and ink superlayers. In some embodiments, a foil may have both an ink superlayer and an ink sublayer. In other embodiments, the foil may have only an ink superlayer, only an ink sublayer, or neither an ink superlayer nor an ink sublayer.

In some embodiments, the foil may retain the shape of the substrate upon removal. For example, when the foil is removed from a curved, non-planar substrate, the foil may retain the curved, non-planar shape of the substrate. In some embodiments, the thickness of the foil may be approximately 2 µm. In other embodiments, the thickness of the foil may be greater than 2 µm. In some embodiments, post-processing may occur after the foil has been removed from the substrate. For example, the foil may be subject to further inspection, assembly, treatment, and similar post-processing tasks upon the foil being removed from the substrate.

Figure 2:
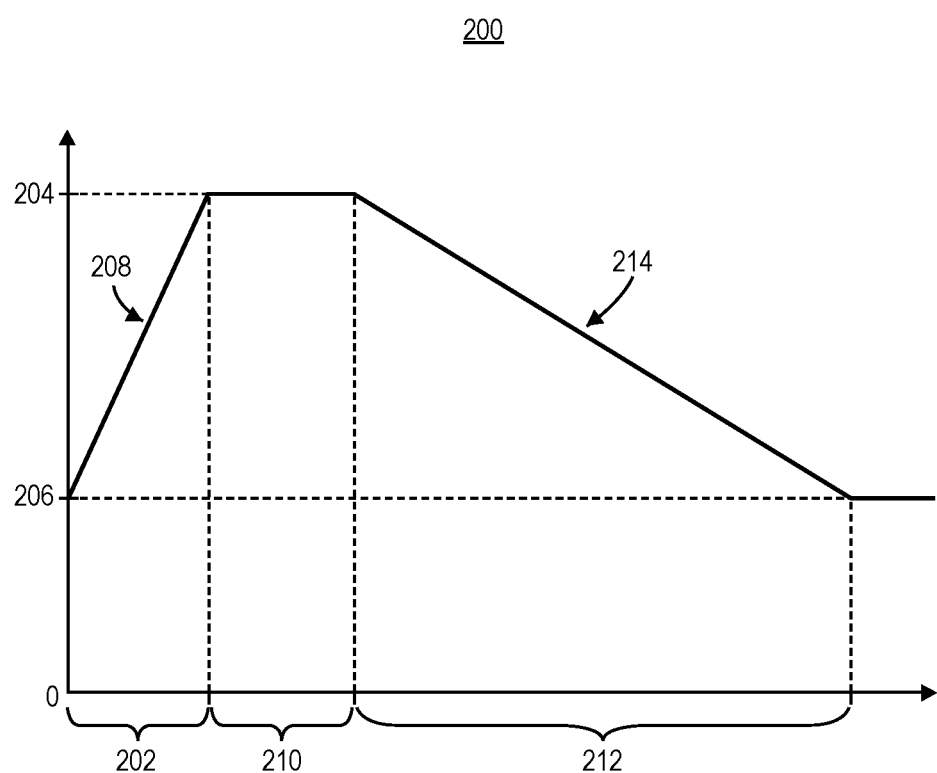
FIG. 2 depicts an example of a heating curve for manufacturing a patterned foil in accordance with embodiments of the invention.

Turning to FIG. 2, an example of a heating curve for manufacturing a patterned foil is depicted and referred to generally by reference numeral 200. During the patterned foil manufacturing process, the patterned foil may be first heated from an initial temperature to a predetermined peak temperature, optionally held at the peak temperature for a period of time, and then cooled to a predetermined temperature. As discussed below, the heating time, peak temperature, hold time, and cooling time may be determined based on the ink material and the relative coefficients of thermal expansion of the substrate, the ink layer, and/or the metallic foil layer.

The peak temperature 204 in which the patterned foil is heated may be dependent on the material composition of the patterned foil, the particular treatment process used on the patterned foil, and similar manufacturing considerations. In some embodiments, the peak temperature 204 the patterned foil may be heated to is approximately 450° C. In other embodiments, the peak temperature 204 the patterned foil is heated to may be approximately 300° C.

Broadly, the rate at which the patterned foil is heated (e.g., temperature-increase ramp rate 208) may influence the amount of delamination that occurs between the patterned foil and the substrate. Temperature-increase ramp rate 208 can be determined by calculating the slope of the curve during the heating period 202. As discussed with regard to peak temperature 204, temperature-increase ramp rate 208 may be selected by analyzing any number of criteria, including treatment processes and material used. In some embodiments, temperature-increase ramp rate 208 may be 25° C./min. In other embodiments, temperature-increase ramp rate 208 may be between 24° C./min and 26° C./min. In still other embodiments, temperature-increase ramp rate 208 may be between 23° C./min and 27° C./min. In further embodiments, temperature-increase ramp rate 208 may be between 20° C./min and 30° C./min.

In some embodiments, peak temperature 204 may be maintained for a holding period 210. Broadly, the length of holding period 210 may be chosen based on any number of criteria, including, but not limited to, inks used, so as to allow the ink to fully metalize (e.g., sinter, cure, or anneal). In some embodiments, holding period 210 may be completed when the patterned foil has delaminated from the substrate. In other embodiments, holding period 210 may be completed after a predetermined amount of time has passed. In further embodiments, holding period 210 may be completed when a particular treatment process has finished (for example, a sintering process).

As discussed above with regard to peak temperature 204, the temperature to which the patterned foil is cooled may be dependent on the material composition of patterned foil, the particular treatment process used on the patterned foil, and similar manufacturing considerations. In some embodiments, the patterned foil may be cooled back down substantially to or near initial temperature 206. In other embodiments, the patterned foil may be cooled back down to a temperature that differs from initial temperature 206.

As discussed above regarding temperature-increase ramp rate 208, the rate at which the patterned foil is cooled (e.g., temperature-decrease ramp rate 214) may influence the amount of delamination that occurs between the patterned foil and the substrate. Temperature-decrease ramp rate 214 can be determined by calculating the slope of the curve during the cooling period 212. As discussed with regard to temperature-increase ramp rate 208, temperature-decrease ramp rate 214 may be selected by analyzing any number of criteria, including treatment processes and material used. In some embodiments, temperature-decrease ramp rate 214 may be approximately 5° C./min. In other embodiments, the temperature decrease ramp rate may be between 3° C./min and 7° C./min. In still other embodiments, the temperature decrease ramp rate may be between 4° C./min and 6° C./min. In further embodiments, the temperature decrease ramp rate may be approximately less than 10° C./min.

In some embodiments, the cooling period 212 may be completed when the patterned foil has delaminated from the substrate. In other embodiments, cooling period 212 may be completed after a predetermined amount of time has passed. In still other embodiments, the cooling period 212 may be completed after a predetermined temperature is reached.

Figure 3:
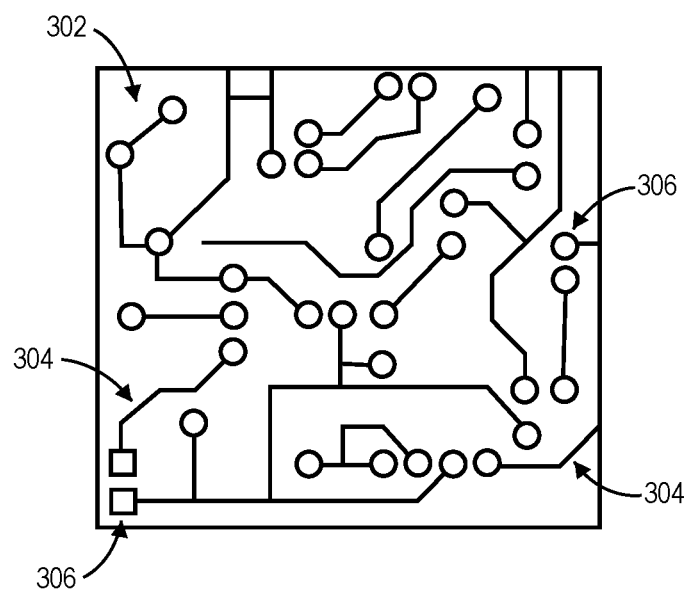
FIG. 3 depicts an example of a multi-layer foil manufactured in accordance with embodiments of the invention.

Turning now to FIG. 3, an example of a multi-layer foil is depicted, consisting of successive layers of metallic foils, with one or more ink sublayers applied to the substrate prior to the ink layer and/or one or more ink superlayers applied to the ink layer subsequent to the ink layer. The ink sublayer(s) and super layer(s) may be distinct metals from the ink layer, or they may be the same metal as the ink layer. It is contemplated that the ink layer may be selected to have the appropriate coefficient of thermal expansion such that sublayers and superlayers may be delaminated from the substrate by their adhesion to the ink layer.

Broadly, multi-layer foil 300 may be utilized for any suitable application known or later developed, including in a differential capacitive accelerometer 400a (depicted in FIG. 4A), differential capacitive accelerometer 400b (depicted in FIG. 4B), and any similar accelerometer system. For another example, multi-layer foil 300 may be used in wearable electronics, stretchable electronics, etc., where the multi-layer foil 300 may be conformal to the surface of a non-rigid material. In another example, multi-layer foil 300 may be used in e-textiles, where the multi-material foil may be conformal to a piece of fabric. In still another example, multi-layer foil 300 may be used as a decorative foil or conductive foil.

In some embodiments, the multi-layer foil 300 may be manufactured using techniques described above with respect to FIG. 1. In such embodiments, multi-layer foil 300 may be the product of step 112, where the multi-layer foil 300 is removed from the substrate after delamination from the substrate has occurred. In some embodiments, multi-layer foil 300 may be conformal to any surface, such as a flat surface or curved surface.

Broadly, the size and thickness of multi-layer foil 300 may be selected based on the application for which it is to be utilized. For example, the size of multi-layer foil 300 may be selected such that the capacitance between multi-layer foil 300 and another electrode may achieve a desired capacitance. In some embodiments, multi-layer foil 300 may have a thickness of approximately 2 µm. In other embodiments, multi-layer foil 300 may have a thickness greater than 2 µm.

In some embodiments, multi-layer foil 300 may include one or more electrical traces 304 and one or more electrical pads 306 on an electrical base 302. In some embodiments, electrical base 302 may be a non-conductive surface, such as a ceramic substrate. In other embodiments, electrical base 302 may be a conductive surface, such as a printed copper layer. In some embodiments, electrical base 302 may serve as a carrier layer to be removed from the remaining layers after manufacturing. For example, electrical base 302 may be a copper layer from which the one or more electrical traces 304 and the one or more electrical pads 306 are to be removed.

In some embodiments, one or more electrical pads 306 may be attached to electrical base 302. In such embodiments, one or more electrical pads 306 may be formed from a conductive material, such as gold or copper. In some embodiments, the material forming the one or more electrical pads 306 may be different from that which forms electrical base 302. In some embodiments, one or more electrical pads 306 may be solderable such that one or more components may be soldered to the one or more electrical pads 306. In such embodiments, one or more solder points may electrically connect two or more components where they may serve the function of providing electrical or physical connectivity. In some embodiments, one or more foil pillars 410 (as depicted in FIG. 4A) may be soldered to one or more electrical pads 306.

In some embodiments, one or more electrical traces 304 may connect one or more electrical pads 306. In some embodiments, as discussed above with respect to the one or more electrical pads 306, one or more electrical traces 304 may be formed from a conductive material. In some embodiments, one or more electrical traces 304 may be formed from the same material as one or more electrical pads 306. In other embodiments, one or more electrical traces 304 may be formed from a different material than that of the one or more electrical pads 306.

Figure 4A:
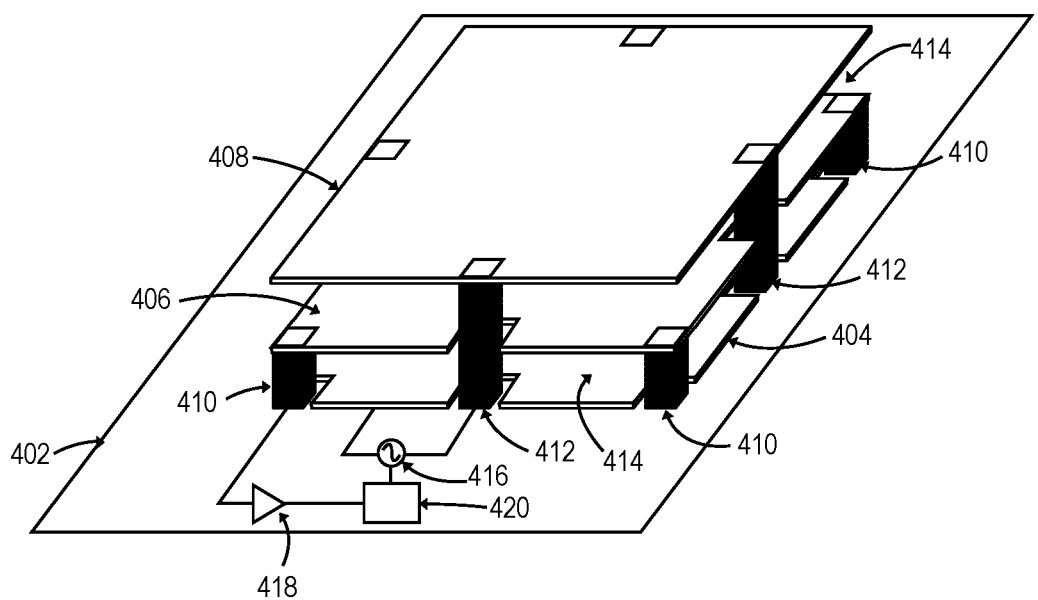
FIG. 4A depicts a first example of a differential capacitive accelerometer in accordance with embodiments of the invention.
Figure 4B:
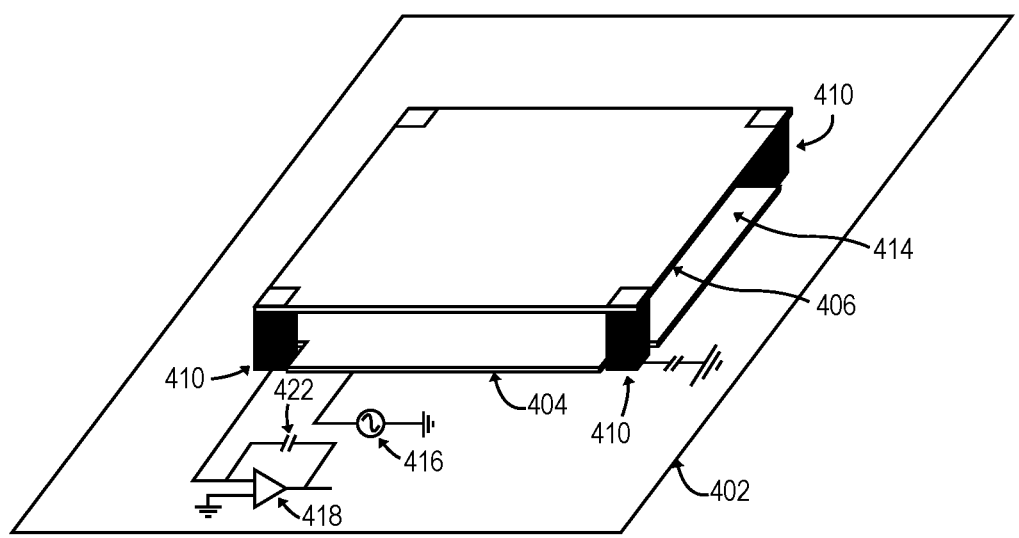
FIG. 4B depicts a second example of a differential capacitive accelerometer in accordance with embodiments of the invention.

Turning to FIGS. 4A-4B, examples of differential capacitive accelerometers are depicted. In some embodiments, differential capacitive accelerometers may be in a flat, planar shape. In other embodiments, the differential capacitive accelerometers may be in a non-planar shape. For example, the differential capacitive accelerometers may be curved conformally to a surface.

Broadly, differential capacitive accelerometers such as differential capacitive accelerometer 400a and differential capacitive accelerometer 400b may be used for any suitable application known in the art. In some embodiments, such differential capacitive accelerometers may be used for various microelectronics applications. For example, differential capacitive accelerometers may be attached to a shipping box and used to discreetly monitor a shipment. For another example, differential capacitive accelerometers may be attached to a human arm in order to track body movement.

Turning now to FIG. 4A, a first example of a differential capacitive accelerometer 400a is depicted. Differential capacitive accelerometer 400a may measure acceleration using two capacitors formed from a movable electrode positioned between two stationary electrodes. When the movable electrode moves closer to one of the stationary electrodes (and farther away from the other stationary electrodes), the capacitance between the stationary electrode and the movable electrode may rise (and vice versa). By applying a known waveform between the stationary electrodes, such changes in capacitance may be based on changing voltage measured between the moveable electrode and one or both of the stationary electrodes.

In some embodiments, differential capacitive accelerometer 400a may be positioned on a base layer 402. In some embodiments, base layer 402 may be a non-conductive surface. For example, base layer 402 may be a ceramic substrate. Alternatively, base layer 402 may be a printed circuit board. Still further, base layer 402 may be an inner or outer layer of a product for measuring the acceleration of the product in transit. In some embodiments, differential capacitive accelerometer 400a, base layer 402 may be conformal to any surface, such as a flat surface or curved surface.

Provided on base layer 402 may be the electrodes making up the layered capacitors of differential capacitive accelerometer 400a, including lower electrode 404, moveable foil electrode 406, and upper electrode 408. In some embodiments, lower electrode 404, moveable foil electrode 406, and upper electrode 408 may be conformal to the shape of base layer 402. For example, lower electrode 404, moveable foil electrode 406, and upper electrode 408 may be conformal to base layer 402 if base layer 402 is curved.

As depicted, moveable foil electrode 406 may be supported by one or more foil pillars 410 arranged at the corners of moveable foil electrode 406, and upper electrode 408 may be supported by one or more stationary electrode pillars 412 arranged at the sides of upper electrode 408. In three-electrode differential capacitive accelerometers, as depicted, moveable foil electrode 406 may be positioned between (stationary) lower electrode 404 and (stationary) upper electrode 408, thereby serving as a movable electrode between the lower electrode 404 and the upper electrode 408.

In some embodiments, lower electrode 404 may be physically connected to the base layer 402. For example, the lower electrode 404 may be soldered onto the base layer 402. The area of lower electrode 404 may directly correlate to the capacitance between lower electrode 404 and moveable foil electrode 406. For example, as the area of lower electrode 404 increases, the capacitance between lower electrode 404 and moveable foil electrode 406 may increase. In some embodiments, the dimensions of lower electrode 404 may be selected in consideration of how the area of lower electrode 404 will affect the capacitance between lower electrode 404 and moveable foil electrode 406.

In some embodiments, lower electrode 404 may be manufactured using method 100 (discussed above). In other embodiments, however, lower electrode 404 may be manufactured using a variation of or an entirely different process than that discussed above with respect to method 100. In particular, lower electrode 404 may be deposited on base layer 402 using any process now known or later developed, including, but not limited to, etching and additive printing. For example, if base layer 402 is a printed circuit board, lower electrode 404 may be formed as a trace on the printed circuit board during the etching process.

Broadly, the material forming lower electrode 404 may be any conductive material, such as a metallic layer. For example, lower electrode 404 may be formed from copper, silver, gold, or any combination thereof. In other embodiments, the material forming lower electrode 404 may be a conductive, nonmetallic material. For example, lower electrode 404 may be formed from graphite.

In some embodiments, lower electrode 404 may be notched in various locations in order to maintain electrical isolation between lower electrode 404, upper electrode 408, and moveable foil electrode 406. For example, lower electrode 404 may be notched at the corners and/or on the sides in order to remain electrically unconnected from one or more foil pillars 410 and one or more stationary electrode pillars 412, respectively.

The distance between lower electrode 404 and moveable foil electrode 406 may correlate to the capacitance between lower electrode 404 and moveable foil electrode 406. For example, as the distance between lower electrode 404 and moveable foil electrode 406 increases, the capacitance between lower electrode 404 and moveable foil electrode 406 may decrease. The distance between upper electrode 408 and moveable foil electrode 406 may affect the capacitance between upper electrode 408 and moveable foil electrode 406 in a similar fashion. Therefore, the distances between lower electrode 404 and moveable foil electrode 406, as well as upper electrode 408 and moveable foil electrode 406, may be selected to achieve desired capacitances.

In some embodiments, a dielectric layer 414 may be provided between lower electrode 404 and moveable foil electrode 406 and between moveable foil electrode 406 and upper electrode 408. The dielectric may prevent electrical contact between the lower electrode 404 and moveable foil electrode 406 and allow greater charge to be stored on the electrodes, thereby enhancing capacitance. In some embodiments, the dielectric layer 414 may be selected for its various properties, including its relative permittivity. The material that makes up dielectric layer 414 may be any dielectric material now known or later developed, including, but not limited to, air, paper, polyester, polypropylene, Mylar, ceramic, glass, oil, and any combinations therein. In some embodiments, the dielectric may be a polymer such as polyimide or ester polymer. In some embodiments, dielectric layer 414 between lower electrode 404 and moveable foil electrode 406 need not be the same dielectric material forming the dielectric layer 414 between upper electrode 408 and moveable foil electrode 406.

Provided above lower electrode 404 (and dielectric layer 414) may be moveable foil electrode 406. In some embodiments, the moveable foil electrode 406 may be manufactured using techniques described above with respect to FIG. 1 and/or FIG. 3. In other embodiments, however, the moveable foil electrode 406 may be manufactured using a variation or entirely different process to that discussed above with respect to method 100. For example, moveable foil electrode 406 may be manufactured using any process known or later developed for manufacturing thin foils, including, but not limited to, lithography processes.

As discussed above with respect to lower electrode 404, the area of moveable foil electrode 406 may correlate to the capacitance between lower electrode 404 and moveable foil electrode 406. In some embodiments, the dimensions of moveable foil electrode 406 may be selected in consideration of how the area of moveable foil electrode 406 will affect the capacitance between lower electrode 404 and moveable foil electrode 406.

As discussed above with respect to lower electrode 404, the material forming moveable foil electrode 406 may be a conductive material. In some embodiments, the material forming moveable foil electrode 406 may be a metallic material such as copper, silver, gold, or any similar conductive metallic material. In other embodiments, the material forming moveable foil electrode 406 may be a conductive, nonmetallic material, such as graphite. As described above, moveable foil electrode 406 may be formed using the process described above with respect to FIG. 1. In such embodiments, the material selected for moveable foil electrode 406 may be selected based on its coefficient of thermal expansion. In other embodiments, moveable foil electrode 406 may be a multi-layer foil manufactured using the process described above with respect to FIG. 3.

In some embodiments, additional material may be added to moveable foil electrode 406 for a specific structural purpose. For example, a material may be added along the edges of moveable foil electrode 406 in order to maintain a more rigid structure along the edge of moveable foil electrode 406. This additional structural material may be added during the process of manufacturing the foil or as a part of the assembly of differential capacitive accelerometer 400a.

In some embodiments, moveable foil electrode 406 may be physically supported on base layer 402 by one or more foil pillars 410. In some embodiments, moveable foil electrode 406 may adhere to one or more foil pillars 410. For example, one or more foil pillars 410 may be soldered onto moveable foil electrode 406. In another example, the one or more foil pillars 410 may be directly deposited onto moveable foil electrode 406 during manufacturing and the combined pillar/foil unit attached to base layer 402 during assembly. In other embodiments, the one or more foil pillars 410 may be additively manufactured on base layer 402 during a first portion of the assembly process and moveable foil electrode 406 attached during a subsequent step (for example, by soldering). In still other embodiments, the one or more foil electrode pillars may be integrated into the conformal substrate. In such embodiments, some or all of the pillars may be plated for conductivity as a part of the process of forming one of the other layers or as a separate process.

In some embodiments, moveable foil electrode 406 may be notched in various locations in order to maintain electrical isolation between lower electrode 404, upper electrode 408, and moveable foil electrode 406. For example, moveable foil electrode 406 may be notched on the sides in order to remain unconnected from one or more stationary electrode pillars 412. This notching may occur as a part of the manufacturing process or subsequent to manufacture.

Provided above moveable foil electrode 406 may be upper electrode 408 (and another dielectric layer 414). As discussed above with respect to lower electrode 404, a dielectric layer 414 may also be placed between the upper electrode 408 and the moveable foil electrode 406, serving the purpose of enhancing an electrical field between the upper electrode 408 and the moveable foil electrode 406. Dielectric layer 414 is further discussed above.

It may be desirable for upper electrode 408 to maintain a rigid structure. As such, upper electrode 408 may be thicker than moveable foil electrode 406 and/or lower electrode 404. For example, upper electrode 408 may be approximately 0.001, 0.002, 0.005, 0.01, 0.02, 0.05, 0.1, 0.2, 0.5, 1 mm thick, or any value within this range. In some embodiments, upper electrode 408 may be manufactured using a variation or entirely different process than that discussed above with respect to method 100. In such embodiments, upper electrode 408 may be manufactured using any process now known or later known, including, but not limited to, etching, plating, vapor deposition, additive printing, and/or any combination of such processes. Alternatively, or in addition, where a solid dielectric layer is used, upper electrode 408 may be formed with a combinative approach of dielectric layering and laser sintering.

Broadly, upper electrode 408 may be formed from any appropriate conductive material. As discussed with respect to lower electrode 404, in some embodiments, the material forming upper electrode 408 may be a metallic material such as copper, silver, gold, or any similar conductive metallic material. In other embodiments, the material forming upper electrode 408 may be a conductive, nonmetallic material such as graphite.

As discussed with respect to moveable foil electrode 406, upper electrode 408 may be physically supported on base layer 402 by one or more stationary electrode pillars 412. In some embodiments, one or more stationary electrode pillars 412 may be soldered onto upper electrode 408. In other embodiments, the one or more stationary electrode pillars 412 may be directly deposited onto upper electrode 408 during manufacturing and the combined pillar/electrode unit attached to base layer 402 during assembly. In still other embodiments, one or more stationary electrode pillars 412 may be additively manufactured on base layer 402 during a first portion of the assembly process and upper electrode 408 attached during a subsequent step (for example, by soldering). In yet other embodiments, one or more stationary electrode pillars can be integrated into the conformal substrate. In such embodiments, some or all of the pillars may be plated for conductivity as a part of the process of forming one of the other layers or as a separate process.

As discussed with respect to lower electrode 404, the area of upper electrode 408 may directly correlatee to the capacitance between upper electrode 408 and moveable foil electrode 406. In some embodiments, the dimensions of upper electrode 408 are selected in consideration of how the area of upper electrode 408 will affect the capacitance between upper electrode 408 and moveable foil electrode 406.

Additionally depicted in FIG. 4A in schematic form is an exemplary electrical circuit for differential capacitive accelerometer 400a. In some embodiments, a waveform generator 416 may be electrically connected to lower electrode 404 and upper electrode 408, providing a voltage potential waveform across lower electrode 404 and upper electrode 408. For example, waveform generator 416 may supply a square waveform across lower electrode 404 and upper electrode 408. In some embodiments, upper electrode 408 may be electrically connected to waveform generator 416 via one or more stationary electrode pillars 412. Similarly, lower electrode 404 may be electrically connected to waveform generator 416 by one or more electrical traces applied to base layer 402.

As discussed above, lower electrode 404 and moveable foil electrode 406 may form a first capacitor, and moveable foil electrode 406 and lower electrode 404 may form a second capacitor. As the voltage potential waveform applied across lower electrode 404 and upper electrode 408 applied by waveform generator 416 changes, these capacitors may result in a voltage waveform being generated at moveable foil electrode 406. Furthermore, as moveable foil electrode 406 is deflected by acceleration of differential capacitive accelerometer 400a, the relationship between the voltage waveform as measured at moveable foil electrode 406 and the input voltage waveform generated by waveform generator 416 may change in a predictable manner that can be used to measure acceleration of differential capacitive accelerometer 400a.

In some embodiments, the moveable foil electrode 406 may be electrically connected to an amplifier 418 via one or more foil pillars 410. In such embodiments, amplifier 418 may receive a voltage input from moveable foil electrode 406. An amplifier such as amplifier 418 may serve to scale the magnitude of the voltage input received. Any electrical signal amplifier now known or later developed is contemplated for use with embodiments of the invention. In some embodiments, moveable foil electrode 406 may be directly connected to demodulator 420, and amplifier 418 may not be present. In other embodiments, amplifier 418 may be integrated into demodulator 420.

In some embodiments, amplifier 418 may be electrically connected to a demodulator 420 (e.g., a synchronous demodulator), whereas demodulator 420 may be electrically connected to waveform generator 416. Demodulator 420 may translate the alternating current (i.e., AC) signal it receives from amplifier 418 into a direct current (i.e., DC) signal using the waveform from waveform generator 416. In some embodiments, the output of demodulator 420 may provide for both magnitude and direction of an acceleration.

In some embodiments, the output of demodulator 420 may be a voltage, where the voltage is correlated to a particular acceleration and direction of acceleration. In such embodiments, when the moveable foil electrode 406 is not displaced from its central position (i.e., differential capacitive accelerometer 400a is not accelerating), the output from demodulator 420 may be zero volts, indicating that the acceleration measured by differential capacitive accelerometer 400a is zero. In some embodiments, when the moveable foil electrode 406 is deflected in a particular direction (i.e., differential capacitive accelerometer 400a is accelerating in the opposite direction), the output from demodulator 420 may be nonzero, indicating that the acceleration measured by differential capacitive accelerometer 400a is greater than zero in a particular direction.

In some embodiments, the output from demodulator 420 may be received by another electrical circuit. For example, a DC voltage output from demodulator 420 may be received by a circuit that performs the necessary calculations to determine acceleration. In some embodiments, the output from demodulator 420 may be stored electronically. For example, the output from demodulator 420 may be stored in a database for later retrieval.

Turning now to FIG. 4B, a second example of a differential capacitive accelerometer 400b is depicted. Where components are identical to those discussed above with respect to differential capacitive accelerometer 400a, identical reference numerals are used. Differential capacitive accelerometer 400b may measure acceleration using a single capacitor formed between a movable electrode and a stationary electrode. When the movable electrode moves closer to the stationary electrode, the capacitance between the stationary electrode and the movable electrode may rise (and vice versa). By applying a known voltage waveform to the stationary electrode, such changes in capacitance may be measured with respect to a known capacitance value of a fixed capacitor and used to calculate a voltage output correlating to acceleration.

As discussed with respect to differential capacitive accelerometer 400a, differential capacitive accelerometer 400b may be positioned on a base layer 402. Base layer 402 may support the electrodes making up the variable capacitor of differential capacitive accelerometer 400b, including lower electrode 404 and moveable foil electrode 406. In some embodiments, lower electrode 404 and moveable foil electrode 406 may be conformal to the shape of base layer 402, as is discussed with regard to differential capacitive accelerometer 400a.

As discussed with respect to differential capacitive accelerometer 400a, lower electrode 404 may be physically connected to the base layer 402. In some embodiments, moveable foil electrode 406 may be supported by one or more foil pillars 410 arranged at the corners of moveable foil electrode 406 and/or separated from lower electrode 404 by dielectric layer 414. All structural and physical considerations of the lower electrode in differential capacitive accelerometer 400a (discussed above) are equally applicable to lower electrode 404 of differential capacitive accelerometer 400b, including, but not limited to, assembly, manufacturing, material, placement, and size.

As noted above, differential capacitive accelerometer 400b may include moveable foil electrode 406 and (stationary) lower electrode 404, as opposed to positioning moveable foil electrode 406 in between lower electrode 404 and an upper electrode. Advantages of differential capacitive accelerometer 400b may include its simpler physical structure (as compared to differential capacitive accelerometer 400a), which may prove to be more cost-effective and less complex during manufacturing and assembly.

Also depicted in FIG. 4B in schematic form is an exemplary electrical circuit for differential capacitive accelerometer 400b. In some embodiments, a waveform generator 416 may be electrically connected to lower electrode 404, providing a voltage potential waveform across lower electrode 404 and moveable foil electrode 406. For example, waveform generator 416 may supply a square waveform across lower electrode 404 and moveable foil electrode 406. In some embodiments, lower electrode 404 may be electrically connected to waveform generator 416 by one or more electrical traces applied to base layer 402.

As discussed above, lower electrode 404 and moveable foil electrode 406 form a variable capacitor. As moveable foil electrode 406 may be deflected by acceleration of differential capacitive accelerometer 400b, the relationship between the voltage waveform as measured at moveable foil electrode 406 and the input voltage waveform generated by waveform generator 416 changes in a predictable manner that can be used to measure acceleration of differential capacitive accelerometer 400b.

In some embodiments, as discussed above with regard to differential capacitive accelerometer 400a, the moveable foil electrode 406 may be electrically connected to an amplifier 418 via one or more foil pillars 410. In such embodiments, amplifier 418 may receive a voltage input from moveable foil electrode 406. In other embodiments, amplifier 418 may be not present. In some embodiments, moveable foil electrode 406 and amplifier 418 may be electrically connected to fixed capacitor 422.

Broadly, the voltage output of the amplifier may be the voltage input scaled by the relation between the variable capacitor capacitance and the capacitance of fixed capacitor 422, where the voltage output may then be correlated to a particular acceleration and direction of acceleration during post-processing calculations. Broadly, as is known in the art, voltage output of a single-capacitor design such as differential capacitive accelerometer 400b may be correlated to acceleration in a nonlinear fashion. It is an advantage of the dual-capacitor design of differential capacitive accelerometer 400a over the single-capacitor design of differential capacitive accelerometer 400b that increased processing of the voltage output of differential capacitive accelerometer 400b may be required in order to properly correlate the voltage output to acceleration.

Many different arrangements of the various components depicted, as well as components not shown, are possible without departing from the scope of the claims below. Embodiments of the invention have been described with the intent to be illustrative rather than restrictive. Alternative embodiments will become apparent to readers of this disclosure after and because of reading it. Alternative means of implementing the aforementioned can be completed without departing from the scope of the claims below. Certain features and subcombinations are of utility and may be employed without reference to other features and subcombinations and are contemplated within the scope of the claims. Although the invention has been described with reference to the embodiments illustrated in the attached drawing figures, it is noted that equivalents may be employed, and substitutions made herein, without departing from the scope of the invention as recited in the claims.

Having thus described various embodiments of the invention, what is claimed as new and desired to be protected by Letters Patent includes the following:

1. A method of manufacturing a patterned metallic foil comprising:
    applying an ink layer in a predetermined pattern onto a substrate such that the ink layer adheres to the substrate,
    wherein the substrate has a substrate coefficient of thermal expansion;
    heating, during a heating stage, the ink layer and the substrate at a temperature increase ramp rate to a predefined target temperature for the ink layer, the heating stage obtaining a metallic layer in the predetermined pattern and with a metallic coefficient of thermal expansion; and
    cooling, during a cooling stage, the metallic layer and the substrate at a temperature decrease ramp rate,
    wherein the metallic layer completely delaminates from the substrate during at least one of the heating stage or the cooling stage, producing the patterned metallic foil,
    wherein a difference between the substrate coefficient of thermal expansion and the metallic coefficient of thermal expansion, in combination with at least one of the temperature increase ramp rate of the heating stage or the temperature decrease ramp rate of the cooling stage, operates to completely delaminate the metallic layer from the substrate.

2. The method of claim 1,
    wherein the temperature increase ramp rate is greater than the temperature decrease ramp rate.

3. The method of claim 2,
    wherein the temperature increase ramp rate is approximately 25 degrees Celsius per minute and the temperature decrease ramp rate is approximately 5 degrees Celsius per minute.

4. The method of claim 1,
    wherein the ink layer comprises copper particles and the metallic layer comprises metallic copper.

5. The method of claim 1,
    wherein the patterned metallic foil has a thickness of approximately 2 µm.

6. The method of claim 1,
    wherein the ink layer is applied to the substrate via aerosol jet printing.

7. The method of claim 1,
    wherein the substrate comprises alumina.

8. The method of claim 1,
    wherein heating the ink layer to the predefined target temperature produces the metallic layer via a process selected from a set consisting of curing, sintering, and annealing.

9. The method of claim 1,
    wherein the substrate has a non-planar surface, and wherein the patterned metallic foil conforms to the non-planar surface.

10. The method of claim 1, further comprising:
    prior to applying the ink layer to the substrate, applying an ink sublayer onto the substrate such that the ink sublayer is at least partially covered by the ink layer,
    wherein the ink layer comprises a first type of metallic particles and the ink sublayer comprises a second type of metallic particles, such that the patterned metallic foil comprises layers of distinct metals.

11. A method of manufacturing a patterned metallic foil comprising:
applying a metallic ink layer in a predetermined pattern onto a substrate such that the metallic ink layer adheres to the substrate,
wherein the substrate has a substrate coefficient of thermal expansion;
heating, during a heating stage, the metallic ink layer and the substrate at a temperature increase ramp rate to a predefined target temperature, the heating stage obtaining a metallic layer in the predetermined pattern and with a metallic coefficient of thermal expansion; and
cooling, during a cooling stage, the metallic layer and the substrate at a temperature decrease ramp rate,
wherein the metallic layer completely delaminates from the substrate during at least one of the heating stage or the cooling stage, producing the patterned metallic foil;
wherein a difference between the substrate coefficient of thermal expansion and the metallic coefficient of thermal expansion, in combination with at least one of the temperature increase ramp rate of the heating stage or the temperature decrease ramp rate of the cooling stage, operates to completely delaminate the metallic layer from the substrate.

* * * * *